US006363036B1

(12) United States Patent
Siepmann

(10) Patent No.: US 6,363,036 B1
(45) Date of Patent: Mar. 26, 2002

(54) LIGHT CLOCK

(75) Inventor: James Patrick Siepmann, Oshkosh, WI (US)

(73) Assignee: Lighttime, L.L.C., Oshkosh, WI (US)

( * ) Notice: Subject to any disclaimer, the term of this patent is extended or adjusted under 35 U.S.C. 154(b) by 0 days.

(21) Appl. No.: 09/474,522

(22) Filed: Dec. 29, 1999

Related U.S. Application Data

(60) Provisional application No. 60/116,517, filed on Jan. 20, 1999, and provisional application No. 60/114,417, filed on Dec. 31, 1998.

(51) Int. Cl.[7] .......................... G04F 10/00; G04F 8/00; H03B 5/20; G01C 3/08

(52) U.S. Cl. .................. 368/113; 368/155; 331/107 R; 331/135; 356/5.01

(58) Field of Search ................................ 368/155–157; 250/227; 331/60, 101, 107, 108, 135; 342/118, 122, 128; 356/5.01–5.08

(56) References Cited

U.S. PATENT DOCUMENTS

| | | | | | |
|---|---|---|---|---|---|
| 3,675,985 | A | | 7/1972 | Gloge | 350/157 |
| 3,789,653 | A | | 2/1974 | Brejaud | 73/6 |
| 4,139,301 | A | | 2/1979 | Chaborski | 356/5 |
| 4,269,506 | A | * | 5/1981 | Johnson et al. | 352/5 |
| 4,297,656 | A | * | 10/1981 | Pan | 331/135 |
| 4,413,905 | A | | 11/1983 | Holzapfel | 356/5 |
| 4,482,259 | A | | 11/1984 | Facklam | 368/118 |
| 4,498,764 | A | | 2/1985 | Bolkow et al. | 356/5 |
| 4,521,107 | A | | 6/1985 | Chaborski et al. | 356/5 |
| 4,905,009 | A | * | 2/1990 | Ulich et al. | 342/118 |
| 4,943,955 | A | | 7/1990 | Rabian et al. | 368/156 |
| 5,210,763 | A | * | 5/1993 | Lewis et al. | 372/26 |
| 5,353,149 | A | | 10/1994 | Urakami et al. | 359/326 |
| 5,665,959 | A | | 9/1997 | Fossum et al. | 250/208.1 |
| 5,708,671 | A | | 1/1998 | Siano et al. | 372/20 |
| 5,760,903 | A | | 6/1998 | Aimi et al. | 356/358 |
| 5,805,468 | A | | 9/1998 | Blohbaum | 364/569 |

FOREIGN PATENT DOCUMENTS

| | | | |
|---|---|---|---|
| GB | 1334640 | * | 10/1973 |

* cited by examiner

*Primary Examiner*—Vit Miska
(74) *Attorney, Agent, or Firm*—John W. Eldredge; Stradling, Yocca, Carlson & Rauth

(57) ABSTRACT

A light clock measures time by having a light pulse source initiating a light pulse which travels a preset distance in an open or closed loop. A counter is increases incrementally upon detection of the light pulse by a light pulse detector. Each increment is a time interval, which is determined by the preset distance divided by the speed of the light pulse. If the loop is an open loop, another light pulse may be initiated upon detection of the previous light pulse. If the loop is a closed loop, no further light pulse initiation beyond the initial light pulse is required, but, when necessary, a light pulse amplifier is used to amplify the light pulse for the next cycle around the closed loop in the light pulse transmission device.

29 Claims, 6 Drawing Sheets

LIGHT CLOCK

CROSS-REFERENCE TO RELATED APPLICATIONS

This application claims priority from previously filed provisional applications, 60/114,417 and 60/116,517 filed on Dec. 31, 1998, and Jan. 20, 1999, respectively.

BACKGROUND

The present invention relates to a timing apparatus, specifically a light clock. The light clock keeps time by incrementing a counter that functions as a timer by measuring an interval it takes a light pulse to travel a preset distance in either an open or a closed loop.

Current technology for time measurement relies on mechanical action, such as wound springs, pendulum, or the measured interval of a regular occurrence of a natural phenomena. One current example is a quartz clock. A quartz crystal vibrates at an ultrasonic frequency when exposed to an electric field, a phenomenon known as the piezoelectric effect. These vibrations of the crystal are constant and deliver a virtually frictionless beat to the counting mechanism of the clock, thus allowing a cycle upon which to base a timepiece.

Another such example is the frequency of radiation produced when an atom makes a quantum jump between two accurately defined energy levels. One current example is a cesium atomic clock. In 1967, the 13th General Conference of Weights and Measures redefined the second as "9,192, 631,770 periods of the radiation corresponding to the transition between the two hyperfine levels of the ground state of the cesium-133 atom." Also, unlike quartz crystals, cesium atoms don't wear out. They can oscillate forever without any distortion whatsoever, but the lasers and electronics needed to run an atomic clock are very expensive and complex.

However all such methods of measuring time are subject to relativity and atomic clocks need constant recalibration to compensate for these relativistic effects. Since the speed of light is a constant, it can be utilized to create a nonrelative means of measuring time. By utilizing a light pulse and a known preset distance in the relative state of an observer, a time interval can be determined by dividing the speed of light by the known predetermined distance.

SUMMARY

The present invention is a light clock, which has a light transmission device with either an open loop or a closed loop of a known predetermined distance for light pulse transmission. By dividing the speed of light by the known predetermined distance of the light transmission device, a time interval can be established and a counter incremented every time the light pulse is detected to create the light clock.

In a first embodiment, the light clock with a light pulse transmission device having a light pulse entry point and a light pulse exit point. This is an open loop a light pulse transmission device. A light pulse source generates a light pulse onto the light pulse entry point for transmission through the light pulse transmission device. The light pulse, upon exit at the light pulse exit point impinges upon a light pulse detector which detects the light pulse and provides an output signal upon light pulse detection. A counter is then incrementally increased upon receipt of the output signal of the light pulse detector. The counter is incremented either with a predetermined time interval, because the path length is known, in which case the light detector needs only to detect the light upon completion of the light pulse travel or it is incremented by the detected time it takes to travel a light pulse path, in which case the light pulse needs to be detected both at initiation and completion of any segment or the complete light pulse path. The light pulse may be detected at any point on the path. In one embodiment, the light pulse transmission device is circular meaning a housing which is cylindrical. In another embodiment the light pulse transmission device has a housing which is in a rectangular shape. In these embodiments one may use fully or partially reflecting mirrors or mirrored surfaces. In another embodiment, the light pulse transmission device is a fiber optic cable. Optionally, in any of these embodiments, the light pulse source may be initiated by the counter, the light pulse detector, or a controller.

In yet another embodiment, a light clock has a light pulse transmission device having a light pulse source entry point. This is a closed loop light pulse transmission device. There is a light pulse source initially generating a light pulse onto the light pulse source entry point, a light pulse detector for detecting the light pulse within the closed loop and providing an output signal upon light pulse detection, a light pulse amplifier within the closed loop for amplifying the light pulse, a counter which is then incrementally increased upon receipt of the output signal of the light pulse detector. The closed loop light pulse transmission device may be either a closed loop having mirrored surfaces with at least three points of reflection having a light pulse source entry point, preferably with one of the three mirrored surfaces being only partially reflecting, or a closed loop fiber optic cable of a known length. Preferably the light pulse transmission device is a closed loop fiber optic cable of a known length having a light pulse source entry point. Optionally, in any of these embodiments, the light pulse amplifier may be initiated by the counter, the light pulse detector, or a controller. Also in any of these embodiments, modulation of the light pulse amplifier may be initiated by the controller.

Figure 1:
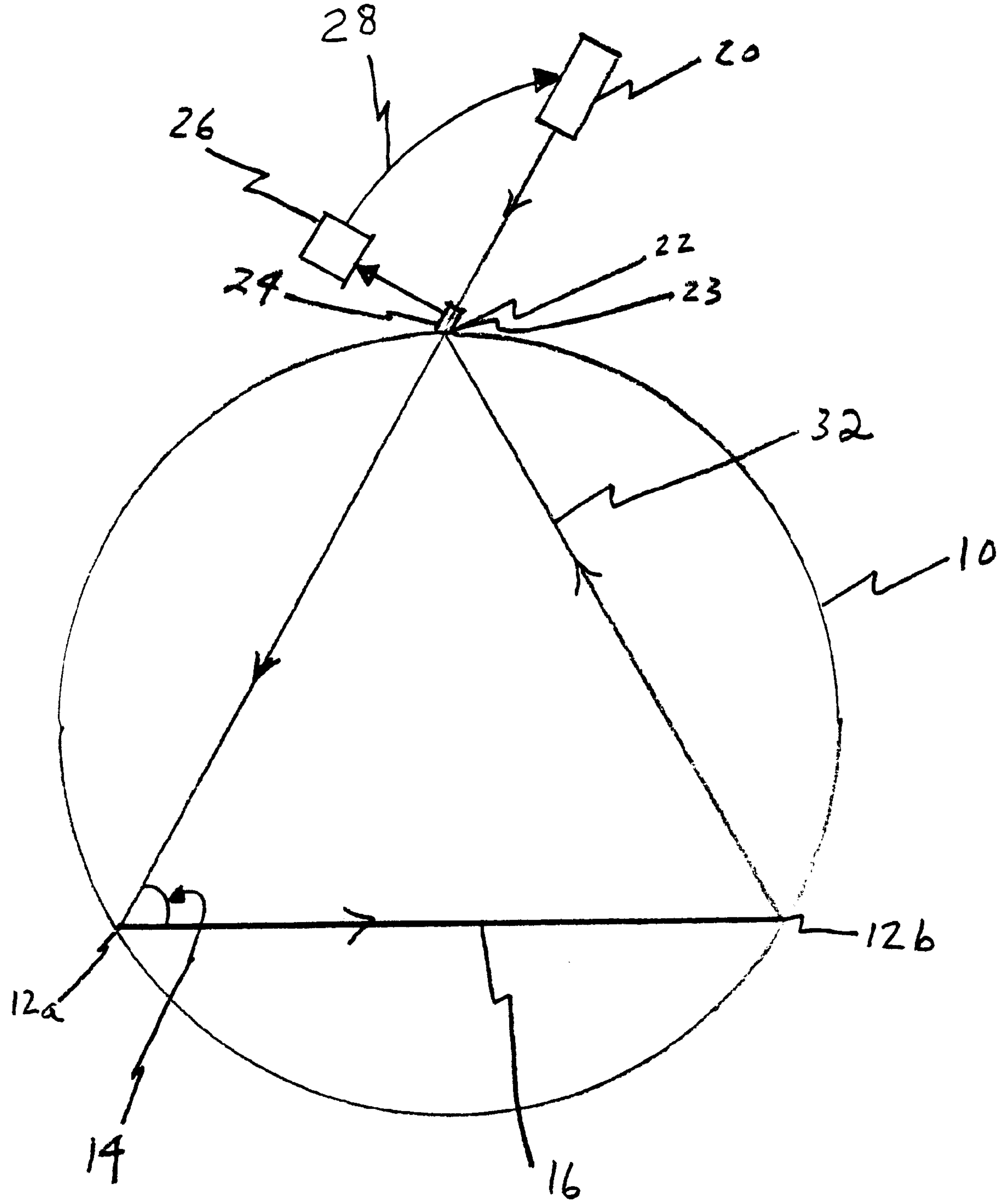
FIG. 1 shows one open loop embodiment of the light clock which utilizes two fully mirrored surfaces in a circular light pulse transmission device.

The invention is not limited in its application to the details of the construction and the arrangement of the components set forth in the following description or illustrated in the drawings. The invention is capable of other embodiments or of being practiced or carried out in various ways.

Also, it is to be understood that the terminology and phraseology employed herein is for purpose of description and illustration and should not be regarded as limiting. Like reference numerals are used to indicate like components.

DETAILED DESCRIPTION OF THE ILLUSTRATED EMBODIMENTS

The light clock of the present invention is a device which measures time by measuring an interval that it takes a light pulse to travel a preset distance in either an open or a closed loop.

The light clock of the present invention has a light pulse transmission device, a light pulse source, a light pulse detector, a counter and if the light pulse transmission device is a closed loop, rather than an open loop, a light pulse amplifier. Optionally the light clock may also have a controller which provides a user interface to the light clock. By “user interface to the light clock” it is meant that the controller may interface with and optionally provide control for any or all parts of the light clock, such as, for example, the light pulse source, the light pulse amplifier and modulation of the light pulse amplifier. The controller may also include the ability to display information about any or all the devices and to display the time. Also, a controller may allow the light clock to function as a stopwatch.

The light pulse transmission device will have mirrors or a mirrored surface which will reflect a light pulse anywhere from one to a near infinite number of times. Alternatively the light transmission device may be a fiber optic cable of a preset distance capable of transmitting the light pulse. In either case the distance through which the light pulse travels will have a known preset distance and thus a known predefined time interval. The light pulse transmission device may also utilize any other methods for light pulse transmission through a known preset distance through the light pulse transmission device.

The light pulse transmission device may either be an open loop or a closed loop light pulse transmission device. In an open loop light pulse transmission device, a light pulse makes only a single loop through the light pulse transmission device. In a closed loop light pulse transmission device, a light pulse is initiated into the closed loop where the light pulse, with amplification of the light pulse as needed, makes multiple loops. There are no light pulse exit points, other than to the light pulse detector which is not considered a light pulse exit point in a closed loop system.

The light pulse source will initiate a light pulse. By “light pulse” it is meant any wavelength of the electromagnetic spectrum of short pulse duration. The light pulse source is preferably a laser. In this application the terms “light” and “light pulse” are used interchangeably, unless specifically stated otherwise.

To start a predefined time interval, a light detector will detect either the initiation of the light pulse, such as the light pulse initiation point or the light pulse at a given location, such as for example at any mirror or mirrored surface. This detection would need to be at an initiation point, such as the light pulse entry point, and completion point, such as the light pulse exit point, in an open loop. Preferably the initiation and termination of the light pulse would occur at the same site to improve accuracy. However, it is not required that any detection occur at a specific point, only that the light pulse travel distance be known. In a closed loop system, detection may occur anywhere in the closed loop system and may occur once or multiple times as the light pulse makes a single complete closed loop path.

In an open loop system the counter or the light detector may have the capability of activating the light pulse source. Optionally a controller may initiate another light pulse source. The controller may also be utilized as an interface between the counter and the user and any other devices which are a part of the light clock. In a closed loop system, since a light source is not needed beyond the initiation of the light source into the closed loop system, the counter or the light pulse detector may have the capability of amplifying the light pulse, when necessary, as it travels the closed loop pathway. Optionally the controller may have the capability of amplifying the light pulse or modulating the light pulse amplifier, when necessary, as the light pulse travels the closed loop pathway. Again a controller may be utilized as an interface between any or all the devices which are a part of the light clock or between a user and any or all the devices which are a part of the light clock.

The initiation, detection, and recording equipment must also be calibrated so there is no time delay due to the electronics. The calibration should be such so that there should be no time delay, or the time delay is compensated for, between light pulse detection and the recording of the time interval.

Figure 2:
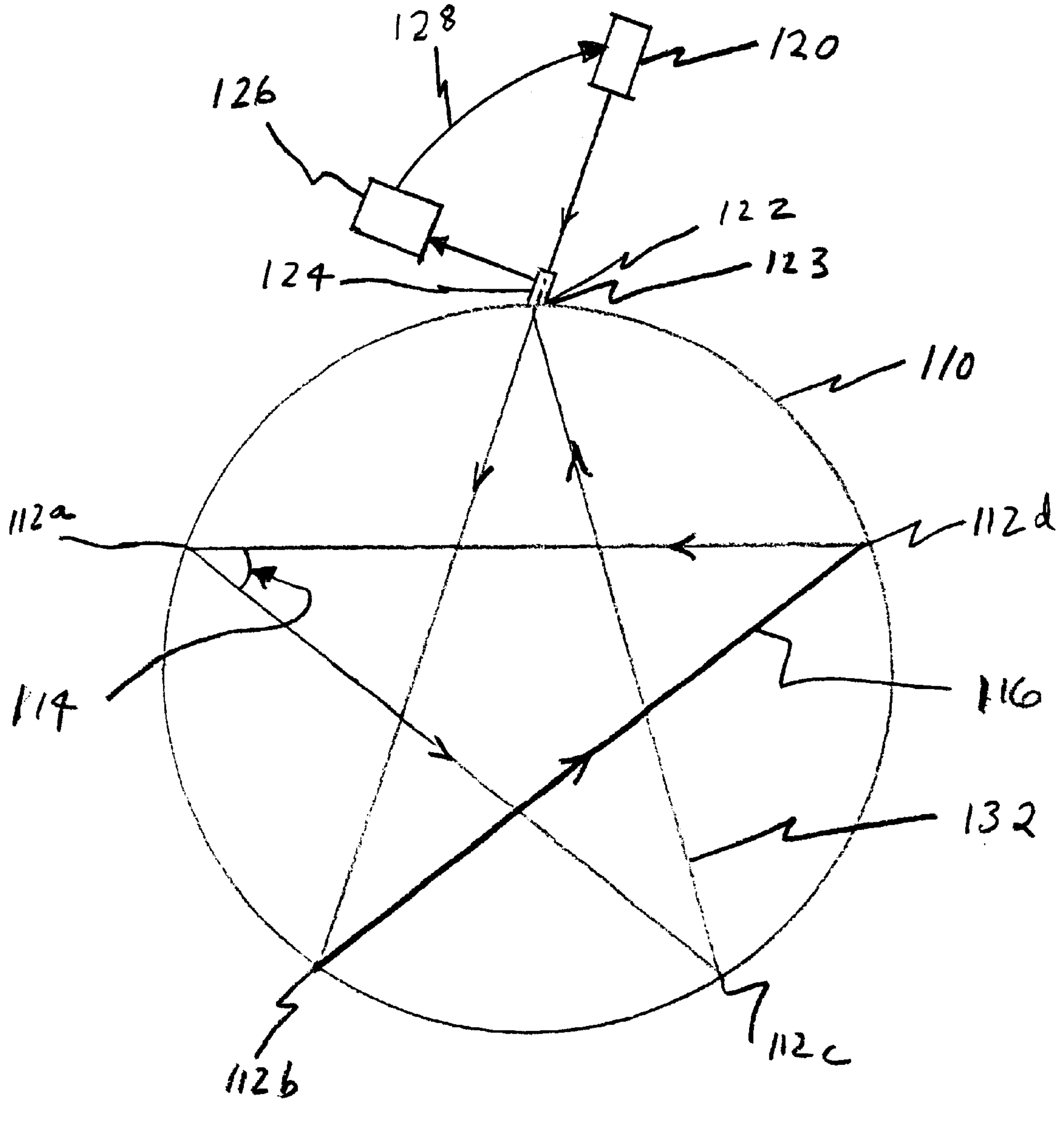
FIG. 2 shows a second open loop embodiment of the light clock which utilizes four fully mirrored surfaces in a circular light pulse transmission device.

In one embodiment of an open loop fully mirrored system, a light pulse that is reflected 300 times in an open loop (with the actual number of reflection s being 299 and the last “reflection” being the point of initial light pulse generation and final point of light pulse detection) with a meter of distance traveled between each reflection would yield a time interval of one microsecond for a total of 300 microseconds to travel the complete path. This light clock could be designated a “1×300 light clock” (1 meter by 300 reflections). Such a light clock could have a light transmission device set up in a linear manner, similar to FIG. 3, however it is preferred that the light transmission device be a circular mirrored surface as shown in FIGS. 1 and 2. For example, in FIG. 2, each of the five reflection paths could be sixty meters for a “60×5 light clock”. By “circular” it is meant that the light pulse travels a circular path and that the housing of such a light pulse transmission device is generally circular or cylindrical.

The light clock may also use multiple light clocks or multiple light clock elements, such as light pulse detectors, or light pulse sources for example, to determine time intervals.

Though more points of reflection and longer paths between reflections will yield the most accurate results in an open loop system, they do not necessarily need to be used in order to define smaller time intervals as a series of the same light clocks could be used which are offset by just one or more reflection(s) to give accurate smaller intervals. For example, a 1×300 light clock would give a time interval of 1 microsecond (1×10−6 s) and if another of the same 1 ×300 light clock was initiated at the same time a third reflection is detected in the first light clock, then a time interval of 10 nanoseconds (3/300 microseconds=10 nanoseconds) could be defined as the time interval between the light pulse initiations of these two light clocks. Another method for obtaining smaller time intervals in an open or closed loop mirror system would be to use a partially reflecting mirror in the light pulse transmission device, at multiple points of reflection, with light detectors on the outer surface receiving a fraction of the light pulse that transmits through the partially reflecting mirror with the remainder of the fraction of the light pulse reflecting to the next fully or partially reflecting mirrored surface or mirror.

One open loop example of the present invention is shown in FIG. 1 which utilizes two mirrored surfaces. In FIG. 1, the light transmission device 10 is circular with inner fully mirrored surfaces at least at points 12*a* and 12*b*. There is an angle of incidence and reflection "a" 14 and a distance "d" 16 which is the distance between the points of reflection. "X" is the number of points of reflection and includes light the entry/exit point (which is not a true reflection point in an open loop system, but is in a closed loop system). Thus for a 1×3 light clock (1 meter between reflections, 3 reflections), d=1 m, x=3 and a=60. A light pulse source 20 generates a light pulse that enters the light pulse entry point 22, while simultaneously activating a light pulse detector 24. After traveling the light pulse path 32, the light pulse exits at the light pulse exit point 23, which is preferably the same as the light pulse entry point and is again detected by light pulse detector 24 which causes the counter 26 to be incremented, which may be part of the controller, as it is here, but it is not required that the controller be part of the counter. The light pulse source is then initiated again by the controller through the light pulse source initiation line 28 from the counter/controller.

FIG. 2 shows a second open loop embodiment of the present invention which utilizes four fully mirrored surfaces 112*a* 112*b* 112*c* 112*d* where d=1m 114, x=5 and a=36 116 in the light pulse transmission device 110. Other than the number of reflections, the device performs as in FIG. 1. A light pulse source 120 generates a light pulse that enters the light pulse entry point 122, while simultaneously activating a light pulse detector 124. After traveling the light pulse path 132, the light pulse exits at the light pulse exit point 123, which is preferably the same as the light pulse entry point and is again detected by light pulse detector 124 which causes the counter 126 to be incremented, which may be part of the controller, as it is here, but it is not required that the controller be part of the counter. The light pulse source is then initiated again by the counter, counter/controller, or controller through the light pulse source initiation line 128 from the controller. The light pulse source could also be initiated by the light pulse detector (not shown). Optionally two light pulse detectors 124 could be located at any of the points 112*a,* 112*b,* 112*c* and 112*d* provided the mirrors are partially reflecting mirrors.

Figure 3:
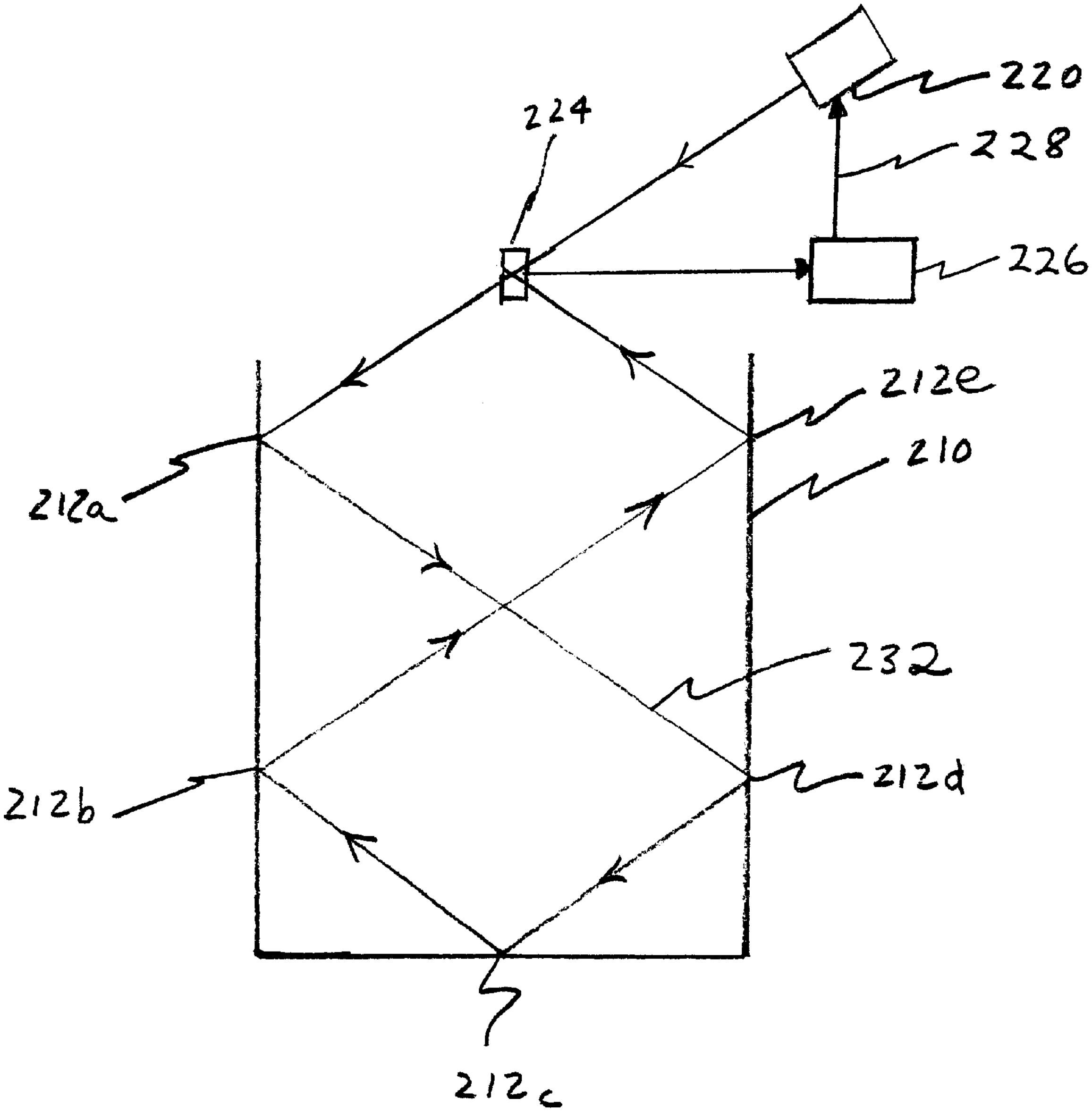
FIG. 3 shows a third open loop embodiment of the light clock which utilizes five fully mirrored surfaces in a rectangular light pulse transmission device.

FIG. 3 shows an open loop linear light pulse transmission device 210 of the present invention having a rectangular housing. This embodiment is not as preferred as the light pulse transmission devices of FIGS. 1 and 2. A light pulse source 220 generates a light pulse that travels a path between fully mirrored surfaces 212*a,* 212*b,* 212*c,* 212*d* and 212*e* and activates a light pulse detector 224. After traveling the light pulse path 232, the light pulse again activates light pulse detector 224 which causes the counter 226 to be incremented, which may be part of the controller, as it is here, but it is not required that the controller be part of the counter. The light pulse source is then initiated again by the counter/controller through the light pulse source initiation line 228 from the controller. By "rectangular" it is meant that the housing of such a light pulse transmission device is generally rectangular.

Figure 4:
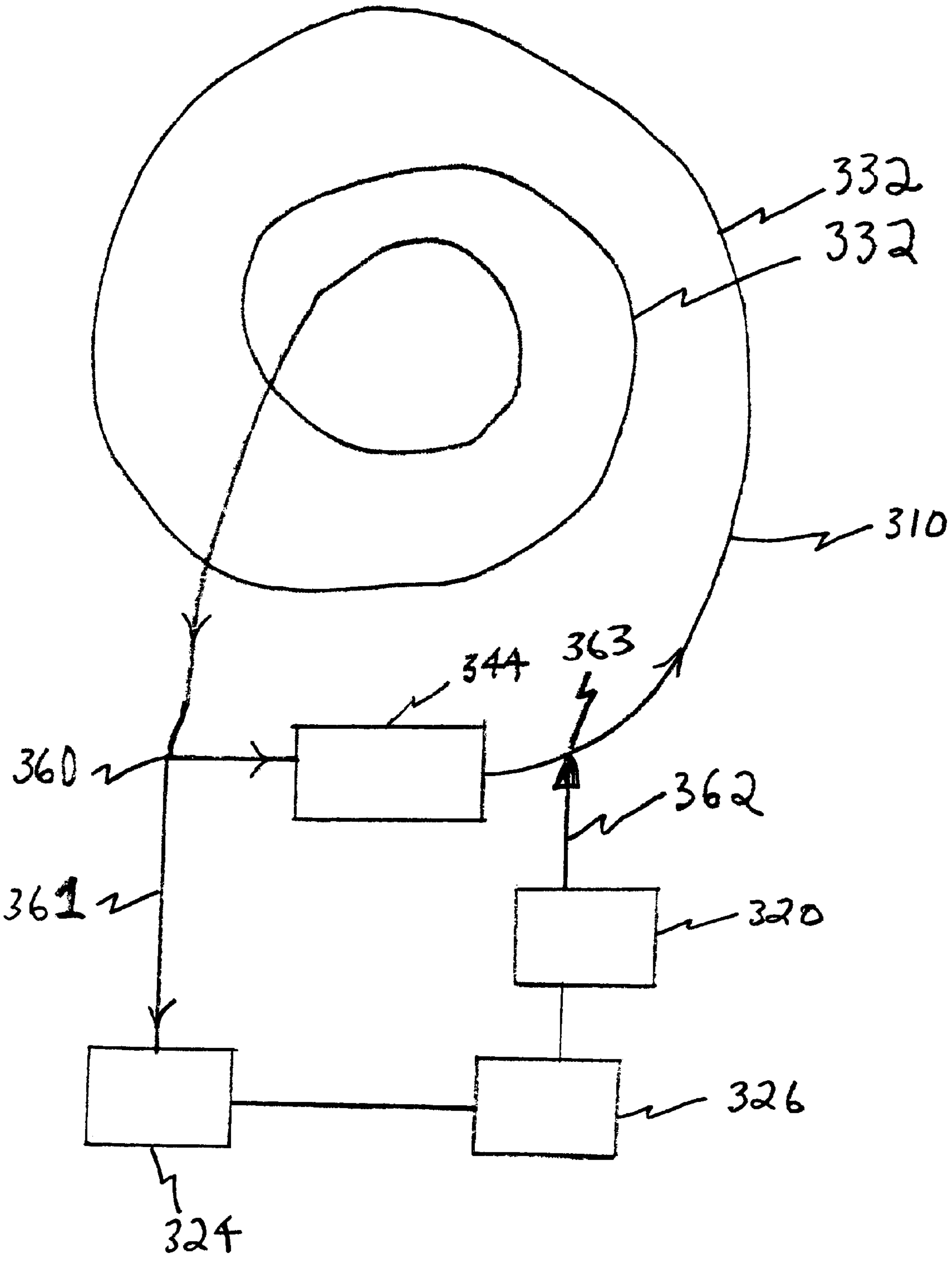
FIG. 4 shows a fourth closed loop embodiment of the light clock which uses a fiber optic cable of a known preset distance in a closed loop and a single fiber optic tap/splitter.

FIG. 4 shows a closed loop embodiment of the present invention where the preset distance is a coiled fiber optic cable 310. In this embodiment the fiber optic cable is a preset length. A light pulse source 320 initiates the light pulse into the closed loop via a fiber optic cable 362 at the light pulse entry point 363 via a fiber optic tap/splitter. The light pulse then travels through the closed loop fiber optic cable according to the closed loop light pulse path 332. When the light pulse reaches a fiber optic tap/splitter 360 in the coiled fiber optic cable the fiber optic tap/splitter routes ten percent or less of the light pulse to a light pulse detector 324 and increments a counter 326, which may include a controller. The time interval for each increment is the fiber optic cable preset distance divided by the speed of light. A light pulse amplifier 344 would amplify the light pulse, as necessary, as it continually travels the closed path of the fiber optic cable. Again the counter and amplifier may be part of the controller, but it is not required that they be so. Also preferably, in order to account for the distance between the input of the light pulse into the light pulse entry point and the detection of the light pulse at the light pulse detector, the combined length of the fiber optic cables 361 and 362 should equal the distance between the fiber optic tap/splitter 360 and the fiber optic tap/splitter 363.

In FIG. 4, in one embodiment, the light pulse is a pulsed laser of 4 watts with a 1550 nanometer wavelength and the amplifying light pulse is a continuous laser of 10 milliwatts with a 1310 nanometer wavelength.

Figure 5:
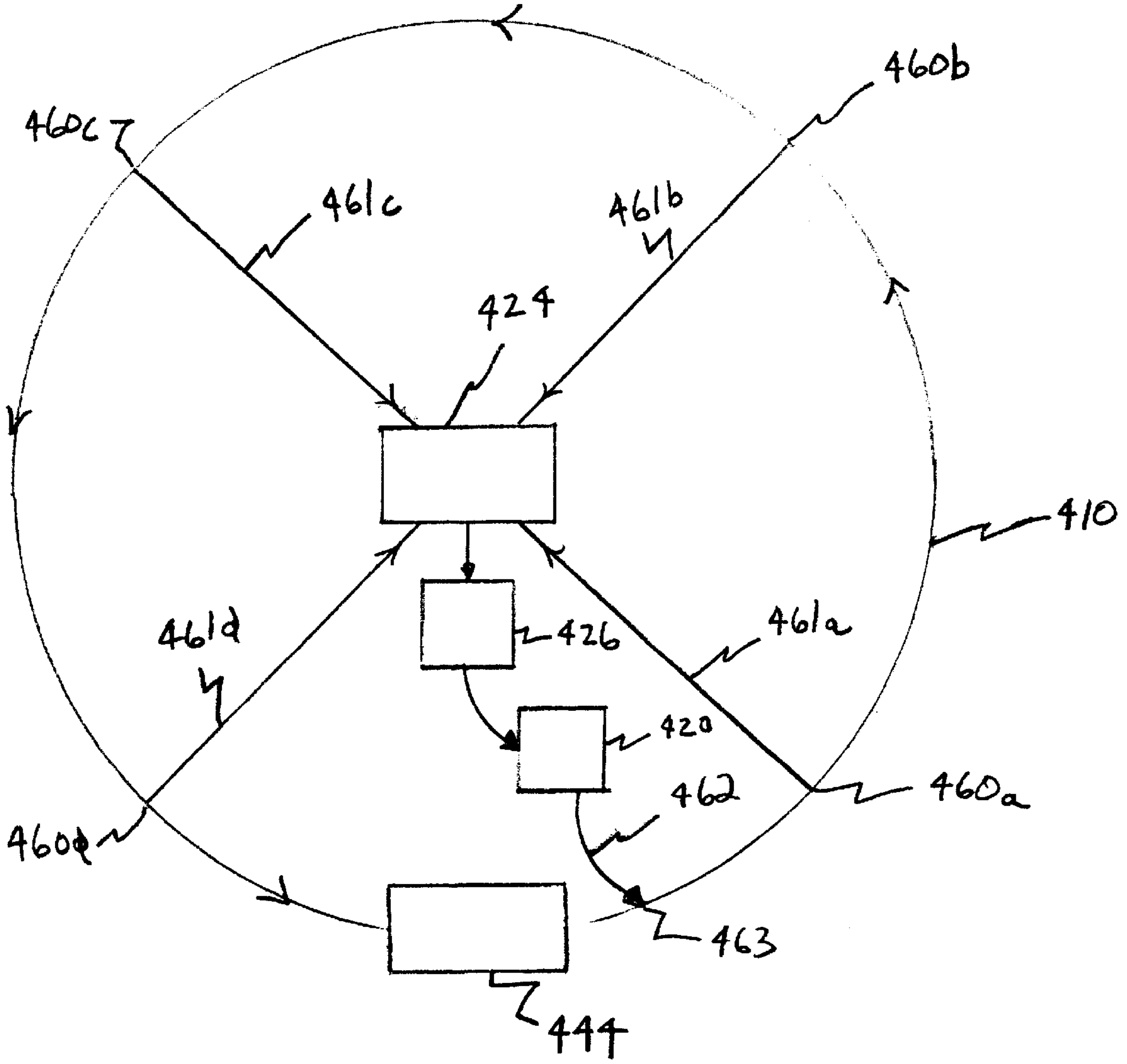
FIG. 5 shows a fifth embodiment of the light clock which uses fiber optic cable in a closed loop and multiple fiber optic taps/splitters.

FIG. 5 shows another closed loop embodiment of the present invention where the preset distance is a closed loop fiber optic cable 410 with four taps/splitters 460*a* 460*b* 460*c* 460*d* with tap/splitter fiber optic cables 461*a* 461*b* 461*c* 461*d* which are equal in length and connect to a light pulse detector 424. A fraction of the light pulse (≦10%) traveling in the closed loop fiber optic cable 410 is tapped by each one of the taps/splitters and sent to the light pulse detector 424 which increments the counter 426, which may include a controller. The time interval of each increment is the preset distance divided by the speed of light. In this embodiment the distance is the length of the fiber optic cable 462 between the light pulse source 420 and the light detector 424 as it travels through tap/splitter 460*a,* which would count as the first increment. Also preferably, in order to account for the distance between the input of the light pulse into the light pulse entry point 463 and the detection of the light pulse at the light pulse detector, the distance of fiber optic cable 462 plus the distance between 463 and 460*a* should be equal to the distance between 460*a* and 460*b*. Subsequent increments between the taps/splitters (460*b* to 460*c;* 460*c* to 460*d* and 460*d* to 460*a*) have the same fiber optic cable lengths which in this embodiment is one quarter the length of fiber optic cable 430. By using a light pulse amplifier 444 to strengthen or amplify the light pulse, the light pulse in this closed loop system can be maintained indefinitely from a single light pulse from the light pulse source 420.

Figure 6:
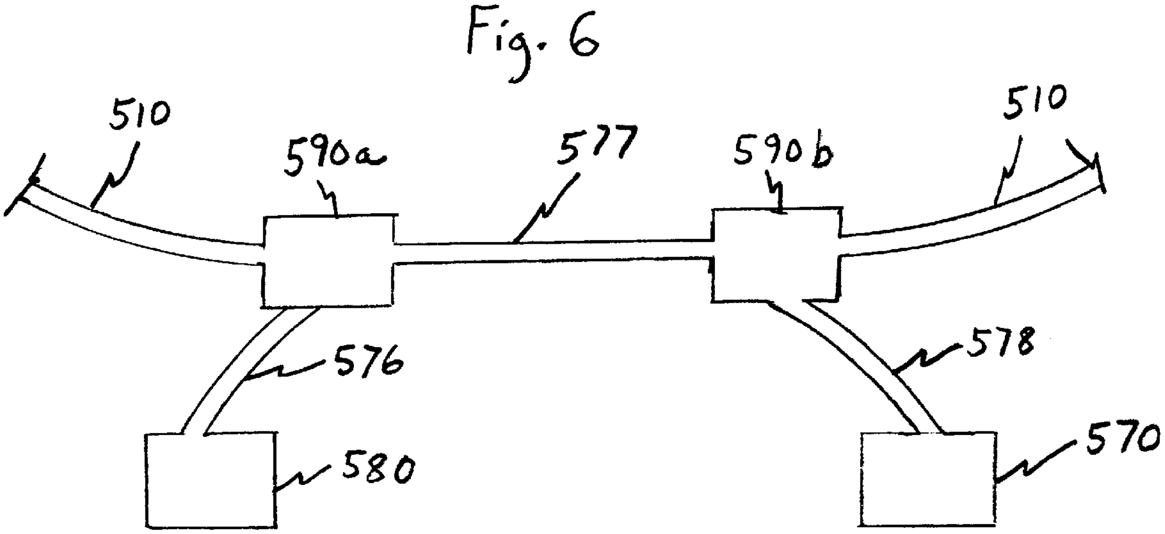
FIG. 6 shows one embodiment of a light pulse amplifier.
Figure 7:
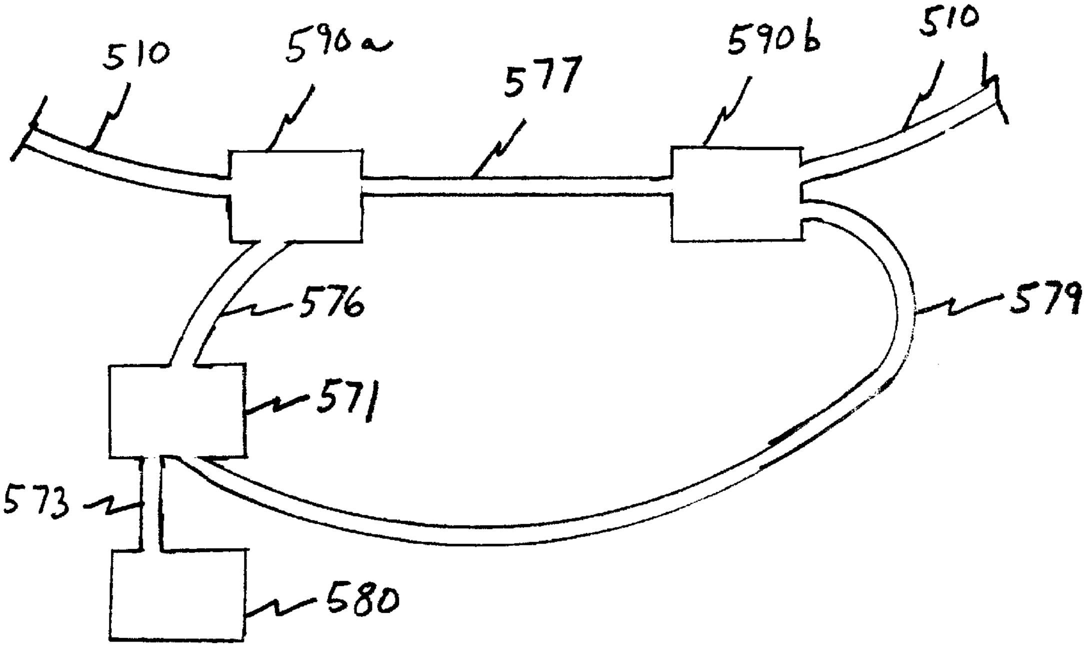
FIG. 7 shows a second embodiment of a light pulse amplifier.

FIGS. 6 and 7 show two possible embodiments of a light pulse amplifier for use in a closed loop fiber optic cable system. Both embodiments use two wavelength division multiplexing devices (WDMs) 590*a* 590*b*. WDM 590*a* has as inputs to the WDM the light pulse traveling in fiber optic cable 510 (equivalent to 310 and 410 in FIGS. 4 and 5 respectively) and an amplifying light from an amplifying light source 580 through a fiber optic cable 576 to WDM 590*a*. The output of WDM 590*a* is then the combined light pulse and amplifying light which travels along a connecting rare earth doped fiber optic cable 577 to WDM 590*b*. WDM 590*b* then separates the amplifying light from the light pulse. In FIG. 6 the amplifying light is then routed via a fiber optic cable 578 to a blind termination 570. In FIG. 7 the amplifying light from the amplifying light source is routed via fiber optic cable 573 to a fiber optic cable coupler 571. In FIG. 7 the amplifying light after being separated at WDM 590*b* is then routed and recirculated through a recirculating fiber optic cable 579 to a fiber optic cable coupler 571 which may then be combined, if necessary, with a new amplifying light provided to the fiber optic coupler via fiber optic cable 573 which is then output to amplifying light fiber optic cable 576. While these are two embodiments of a light pulse amplifier, the present invention is not restricted to these specific light pulse amplifiers, but may utilize any light pulse amplifier which provides the light pulse amplification necessary to keep the light pulse traveling in the closed loop path while being detected by the light pulse detector.

Those skilled in the art will now see that certain modifications can be made to the invention herein disclosed with respect to the illustrated embodiments, without departing from the spirit of the instant invention. And while the invention has been described above with respect to the preferred embodiments, it will be understood that the invention is adapted to numerous rearrangements, modifications, and alterations, all such arrangements, modifications, and alterations are intended to be within the scope of the appended claims.

Having thus described the invention, what is claimed is:

1. A light clock, comprising:

(a) a light pulse transmission device having a light pulse entry point and a light pulse exit point;

(b) a light pulse source for generating a light pulse into the light pulse entry point;

(c) a light pulse detector for detecting the light pulse at the light pulse exit point and providing an output signal upon light pulse detection;

(d) a counter which is incrementally increased upon receipt of the output signal of the light pulse detector; and (e) wherein the light pulse detector comprises at least two light pulse detectors at separate points along a light pulse path in the light pulse transmission device with a first light pulse detector providing a light pulse detector initiation signal and a second providing a light pulse detector output signal and the counter is incrementally increased with a time difference between the first light pulse detector initiation signal and the second light pulse detector output signal.

2. A light clock, as in claim 1, wherein the counter initiates the light pulse source to generate another light pulse.

3. A light clock, as in claim 1, wherein the light pulse detector initiates the light pulse source to generate another light pulse.

4. A light clock, as in claim 1, further comprising a controller which provides a user interface to the light clock.

5. A light clock, as in claim 4, wherein the controller initiates the light pulse source to generate another light pulse.

6. A light clock, as in claim 1, wherein the light pulse transmission device has a mirrored surface with at least two points of reflection.

7. A light clock, as in claim 6, wherein the light pulse transmission device has a housing which is circular.

8. A light clock, as in claim 1, wherein the light pulse transmission device has a mirrored surface with at least four points of reflection.

9. A light clock, as in claim 8, wherein the light transmission device has a housing which is circular.

10. A light clock, as in claim 1, wherein the light pulse transmission device is a fiber optic cable having a known length.

11. A light clock, as in claim 1, wherein the light pulse source is a pulsed laser.

12. A light clock, as in claim 1, wherein the light pulse detector detects the light pulse at the light pulse entry point and provides a light pulse initiation signal to the counter.

13. A light clock, as in claim 1, wherein the counter is incrementally increased by a distance between the light pulse entry point and the light pulse exit point divided by the speed of light.

14. A light clock, comprising:

(a) a light pulse transmission device having a light pulse source entry point;

(b) a light pulse source for generating a light pulse onto the light pulse source entry point;

(c) a light pulse amplifier within the closed loop for amplifying the light pulse;

(d) a light pulse detector for detecting the light pulse within the closed loop and providing an output signal upon light pulse detection;

(e) a counter which is incrementally increased upon receipt of the output signal of the light pulse detector; and (f) wherein the light pulse transmission device is a closed loop fiber optic cable of a known length and wherein the light clock further comprises a fiber optic tap/splitter as the light pulse source entry point.

15. A light clock, as in claim 14, wherein the counter initiates the light pulse amplifier.

16. A light clock, as in claim 14, wherein the light pulse detector initiates the light pulse amplifier.

17. A light clock, as in claim 14, further comprising a controller which provides a user interface to the light clock.

18. A light clock, as in claim 17, wherein the controller initiates the light pulse amplifier to amplify the light pulse.

19. A light clock, as in claim 17, wherein the controller modulates the light pulse amplifier.

20. A light clock, as in claim 17, wherein the controller initiates the light pulse source to generate the light pulse onto the light pulse source entry point.

21. A light clock, as in claim 14, wherein the light clock further comprises a fiber optic tap/splitter within the closed loop for splitting a portion of the light pulse in the closed loop fiber optic cable to the light pulse detector.

22. A light clock, as in claim 21, wherein the fiber optic tap/splitter splits no more than ten percent of the light pulse from within the closed loop fiber optic cable.

23. A light clock, as in claim 21,the fiber optic tap/splitter further comprising at least four fiber optic tap/splitters within the closed loop for splitting a portion of the light pulse in the closed loop fiber optic cable to the light pulse detector.

24. A light clock, as in claim 14, wherein the light pulse source is a pulse laser.

25. A light clock, as in claim 14, wherein the light pulse source is a pulsed laser having a wavelength of 1550 nanometers.

26. A light clock, as in claim 14, wherein the light pulse amplifier comprises:

(a) a first wavelength division multiplexing device having inputs of the light pulse from the closed loop fiber optic cable and an amplifying light to a combined output of the light pulse and the amplifying light;

(b) a second wavelength division multiplexing device having an input of the combined light pulse and the amplifying light and outputs of the light pulse, now amplified, to the closed loop fiber optic cable and the amplifying light; and (c) a rare earth doped fiber optic cable connecting the output of the first wavelength division multiplexing device to the input of the second wavelength division multiplexing device.

27. A light clock, as in claim 26, wherein the amplifying light pulse is a continuous laser having a wavelength of 1310 nanometers.

28. A light clock, as in claim 14, wherein the light pulse transmission device is a closed loop having mirrored surfaces with at least three points of reflection.

29. A light clock, as in claim 28, wherein the light pulse transmission device is a closed loop having mirrored surfaces with at least one of the three points of reflection being a partially reflecting mirrored surface.

* * * * *